(12) United States Patent
Suehiro et al.

(10) Patent No.: US 6,998,777 B2
(45) Date of Patent: Feb. 14, 2006

(54) LIGHT EMITTING DIODE AND LIGHT EMITTING DIODE ARRAY

(75) Inventors: Yoshinobu Suehiro, Aichi-ken (JP); Mitsuhiro Inoue, Aichi-ken (JP); Hideaki Kato, Aichi-ken (JP); Tatsuya Takashima, Aichi-ken (JP)

(73) Assignee: Toyoda Gosei Co., Ltd., Aichi-ken (JP)

( * ) Notice: Subject to any disclaimer, the term of this patent is extended or adjusted under 35 U.S.C. 154(b) by 106 days.

(21) Appl. No.: 10/731,104

(22) Filed: Dec. 10, 2003

(65) Prior Publication Data

US 2004/0169466 A1    Sep. 2, 2004

(30) Foreign Application Priority Data

Dec. 24, 2002  (JP)  .............................. 2002-372437
Dec. 26, 2002  (JP)  .............................. 2002-377965

(51) Int. Cl.
*H01J 1/02* (2006.01)
(52) U.S. Cl. .................... 313/512; 313/506; 313/11; 313/45
(58) Field of Classification Search ................ 313/498, 313/506, 509, 512, 11, 45
See application file for complete search history.

(56) References Cited

U.S. PATENT DOCUMENTS 6,639,360 B1 *  10/2003  Roberts et al. ............. 313/512
2004/0124772 A1 *  7/2004  Chen ......................... 313/582

FOREIGN PATENT DOCUMENTS

| JP | 9-181394 | 7/1997 |
|----|----------|--------|
| JP | 11-112025 | 4/1999 |
| JP | 11-177129 | 7/1999 |

* cited by examiner

*Primary Examiner*—Vip Patel
(74) *Attorney, Agent, or Firm*—McGinn IP Law Group, PLLC

(57) ABSTRACT

A light emitting diode has: a ceramics substrate that has a high thermal conductivity; a light emitting element that is mounted on the ceramics substrate; and a radiation plate that is bonded to the back surface of the ceramics substrate. The radiation plate contacts the ceramics substrate at a contact region that includes a region of the back surface of the ceramics substrate corresponding to a region of the ceramics substrate on which the light emitting element is mounted.

18 Claims, 8 Drawing Sheets

LIGHT EMITTING DIODE AND LIGHT EMITTING DIODE ARRAY

The present application is based on Japanese patent application Nos. 2002-372437 and 2002-377965, the entire contents of which are incorporated herein by reference.

BACKGROUND OF THE INVENTION

1. Field of the Invention

This invention relates to a light emitting diode with such an enhanced radiation property that can be adapted even to a light emitting element to be fed with large current.

Also, this invention relates to a SMD (surface mount device) type LED that can prevent the disconnection of wire or the peeling of wire from substrate or light emitting element in reflowing and sealing.

Herein, an LED chip itself is referred to as light emitting element, and an entire LED chip mounting device including an optical member such as package resin and lens system is referred to as light emitting diode or LED.

2. Description of the Related Art

FIG. 1 is a cross sectional view showing an example of conventional flip-chip type LED. As shown in FIG. 1, the flip-chip type LED 51 is structured such that two electrodes provided at the bottom surface of a light emitting element 52 are connected through Au bumps 53 to an Au plating circuit pattern 54 formed on an alumina substrate 55, and the Au plating circuit pattern 54 is connected to a pair of thick metal leads 56. From the viewpoint of radiation, it is desirable that the light emitting element 52 is connected through the bumps 53 to the metal leads 56. However, a gap between the leads 56 cannot be reduced to less than the thickness of lead member. So, unavoidably, the two-stage structure shown in FIG. 1 is employed. This structure lacks in radiation property since the path to radiate heat generated from the light emitting element 52 is made of thin member. Therefore, the structure cannot be adapted to a light emitting element having a large amount of heat generation, such as a light emitting element to be fed with large current.

Japanese patent application laid-open No. 9-181394 (hereinafter referred to as prior art 1) discloses a laser diode (LD) with improved radiation property.

Prior art 1 relates to a problem that, when an LD with negative and positive electrodes on the same surface and a step between them is soldered to a submount (heat sink), LD is mounted on the submount with a lean so that a contact area therebetween becomes small to lower the radiation. So, prior art 1 improves the radiation from LD to submount by that the submount is provided with the same step as LD such that LD is mounted on the submount with no lean to increase the contact area between the electrodes and submount.

However, prior art 1 does not teach a further radiation means from the submount to outside and, since the submount has equal size to LD and lacks in radiation property, the temperature of LD in operation will rise.

FIG. 2 is a cross sectional view showing an example of conventional SMD type LED. As shown in FIG. 2, the LED 131 is structured such that a metal (Au or Ag) plating circuit pattern 137 is formed on a glass epoxy substrate 132, a light emitting element 133 is mounted on the circuit pattern 137, and electrodes on the light emitting element 133 are wire-bonded through two wires 134 to insulated regions of the circuit pattern 137. Further, the entire device is sealed with transparent epoxy resin 136 to protect the light emitting element 133 and to serve as a lens.

However, since the glass epoxy substrate 132 has a bad radiation property and there is no path to radiate heat generated from the light emitting element 133 in operation, the temperature of light emitting element 133 will rise so that the efficiency of emission is reduced and the life cycle is deceased. So, another type of LED is suggested that, instead of the printed circuit board 132, a light emitting element is mounted on one of a pair of metal leads and is wire-bonded to the other of the metal leads and the entire device is sealed with transparent epoxy resin. In this type of LED, the problem of radiation can be solved since heat is radiated through the metal lead on which the light emitting element is mounted.

However, since the transparent epoxy resin for sealing the entire device has a coefficient of thermal expansion nearly five times that of metal, when subjected to reflowing at a high temperature (about 200 to 300° C.) in surface mounting, the disconnection of wire or the peeling of wire from substrate or light emitting element may occur due to the difference in coefficient of thermal expansion.

Japanese patent application laid-open No. 11-12025 (hereinafter referred to as prior art 2) discloses an example of conventional SMD type LED.

In prior art 2, a ceramics substrate is used that has a good thermal conductivity, a low coefficient of thermal expansion and an excellent heat resistance. The substrate has terminal electrodes on its ends, a light emitting element is mounted on the center of substrate, two electrodes on the surface of light emitting element are wire-bonded to the terminal electrodes, and the entire device is molded with transparent epoxy resin to offer a package.

Although in prior art 2 there is no problem of radiation property because of the ceramics substrate with a good thermal conductivity, the disconnection of wire or the peeling of wire from substrate or light emitting element may occur in reflowing since the entire device is molded with transparent epoxy resin.

Japanese patent application laid-open No. 11-177129 (hereinafter referred to as prior art 3) discloses another example of conventional SMD type LED.

In prior art 3, in stead of transparent epoxy resin, low melting point (nearly equal to 400° C.) glass is used as sealing material. A light emitting element mounted on a ceramics substrate is directly sealed by the low melting point glass without sandwiching resin therebetween. Thereby, the disconnection of wire or the peeling of wire from substrate or light emitting element in reflowing at high temperature can be prevented.

However, in prior art 3, since the low melting point glass has a viscosity significantly higher than that of transparent thermo-setting resin, such as transparent epoxy resin, before setting even when being melted, the disconnection of wire or the peeling of wire from substrate or light emitting element may occur due to stress to be applied by the high viscosity low melting point glass in sealing therewith.

As described above, prior art 1 lacks in radiation property. On the other hand, prior arts 2 and 3 have the problem that the disconnection of wire or the peeling of wire from substrate or light emitting element may occur in reflowing or sealing, though there is no problem of radiation.

SUMMARY OF THE INVENTION

It is an object of the invention to provide an LED and an LED array with such an enhanced radiation property that can be adapted even to a light emitting element to be fed with large current.

It is another object of the invention to provide an LED that can prevent the disconnection of wire or the peeling of wire from substrate or light emitting element in reflowing and sealing.

(1) According to the invention, a light emitting diode comprises:

a ceramics substrate that has a high thermal conductivity;

a light emitting element that is mounted on the ceramics substrate; and a radiation plate that is bonded to the back surface of the ceramics substrate;

wherein the radiation plate contacts the ceramics substrate at a contact region that includes a region of the back surface of the ceramics substrate corresponding to a region of the ceramics substrate on which the light emitting element is mounted. The ceramics with high thermal conductivity include aluminum nitride (AlN) etc.

Thereby, heat generated from the light emitting element in operation is directly conducted to the ceramics substrate with high thermal conductivity, further conducted to the radiation plate, then radiated from the surface of radiation plate in the air. Thus, in LED of the invention, heat is conducted through the entire ceramics substrate on which the light emitting element is mounted. Therefore, it has an excellent radiation property. Moreover, since the radiation plate contacts the ceramics substrate at a contact region that includes a region of the back surface of the ceramics substrate corresponding to a region of the ceramics substrate on which the light emitting element is mounted, heat is further rapidly conducted to the radiation plate.

Accordingly, the light emitting diode has such an enhanced radiation property that can be adapted even to a light emitting element to be fed with large current.

(2) In LED of (1), it is preferred that the light emitting element is flip-chip mounted on the ceramics substrate. Thus, the positive and negative electrodes on the lower surface of light emitting element are directly mounted through Au bumps on electrodes of circuit pattern formed on the ceramics substrate with high thermal conductivity. Therefore, it offers a structure with an excellent radiation property.

(3) In LED of (1), it is preferred that the radiation plate is of a metal and is folded into waveform outside the ceramics substrate. Thus, the folded part into waveform of the metal radiation plate serves as a radiation fin. Therefore, the radiation property of radiation plate is further enhanced.

(4) In LED of (1), it is preferred that the radiation plate has a plurality of penetrating holes. Thus, the convection of air around the radiation plate is promoted. Therefore, the radiation property of radiation plate is further enhanced.

(5) In LED of (1), it is preferred that the radiation plate is of a metal and is provided with a plurality of radiation fins that are formed by making a cut in the radiation plate and folding the inside portion of the cut. Thus, with the radiation fins and penetrating holes formed simultaneously, the surface area of radiation plate is increased and the convection of air around the radiation plate is promoted. Therefore, the radiation property of radiation plate is significantly enhanced and heat from the light emitting element is radiated further efficiently in the air.

(6) According to another aspect of the invention, a light emitting diode array comprises:

a plurality of light emitting diodes each of which comprises:

a ceramics substrate that has a high thermal conductivity;

a light emitting element that is mounted on the ceramics substrate; and a radiation plate that is bonded to the back surface of the ceramics substrate;

wherein the radiation plate contacts the ceramics substrate at a contact region that includes a region of the back surface of the ceramics substrate corresponding to a region of the ceramics substrate on which the light emitting element is mounted; and a circuit board on which the plurality of light emitting diodes are mounted, the circuit substrate including a through-hole.

Thereby, heat generated from the light emitting element in operation is directly conducted to the ceramics substrate with high thermal conductivity, further conducted to the radiation plate, then radiated from the surface of radiation plate in the air. Thus, heat is conducted through the entire ceramics substrate on which the light emitting element is mounted. Therefore, it has an excellent radiation property. Moreover, since the radiation plate contacts the ceramics substrate at a contact region that includes a region of the back surface of the ceramics substrate corresponding to a region of the ceramics substrate on which the light emitting element is mounted, heat is further rapidly conducted to the radiation plate.

Accordingly, the LED array has such an enhanced radiation property that can be adapted even to a light emitting element to be fed with large current.

(7) According to another aspect of the invention, a light emitting diode comprises:

a circuit board that includes a plurality of penetrating holes, each of which having a narrowed portion;

a ceramics substrate that is mounted on the circuit board while bridging the narrowed portion, the ceramics substrate having a high thermal conductivity;

a light emitting element that is mounted on a circuit pattern of the ceramics substrate; and a radiation plate that is bonded to the back surface of the ceramics substrate and extends in one of the plurality of penetrating holes without contacting the edge of the one of the plurality of penetrating holes and;

wherein the circuit pattern of the ceramics substrate is electrically connected to a circuit pattern of the circuit board at the bridged narrowed portion.

Thereby, the light emitting element is electrically connected to a power supplying line of the circuit board, and heat generated from the light emitting element in operation is conducted through the entire ceramics substrate with high thermal conductivity to the radiation plate bonded on the lower surface of ceramics substrate. The radiation plate has a surface area significantly greater than the light emitting element. Therefore, heat from the light emitting element is efficiently radiated from the radiation plate in the air.

Accordingly, the LED array has such an enhanced radiation property that can be adapted even to a light emitting element to be fed with large current.

(8) According to another aspect of the invention, a light emitting diode array comprises a plurality of the light emitting diodes defined in (7).

Thereby, LED's with excellent radiation property are integrated on the circuit board. Since the circuit board does not serve as radiation means, LED's can be disposed in number, arrangement and interval according to the intended use of LED array. Each light emitting element can be provided with optical system according to the intended use.

Thus, in the LED array, LED's with excellent radiation property can be disposed on the circuit board according to the intended use.

(9) In LED of (7) or LED array of (8), it is preferred that the radiation plate has a plurality of penetrating holes. Thereby, the radiation property of radiation plate is further enhanced.

(10) In LED of (7) or LED array of (8), it is preferred that the radiation plate is of a metal and is provided with a plurality of radiation fins that are formed by making a cut in the radiation plate and folding the inside portion of the cut. Thereby, the radiation property of radiation plate is further enhanced.

(11) According to another aspect of the invention, a light emitting diode comprises:

a substrate that has a low coefficient of thermal expansion and a high thermal resistance;

a circuit pattern that is formed using a conductive material on the substrate;

a light emitting element that is mounted on the surface of the substrate;

a metal member that electrically connects the light emitting element to the circuit pattern;

a glass lens that covers the periphery of the light emitting element while leaving a space and a resin injection hole, the space being defined to house the light emitting element and the metal member;

a sealing material that seals the surface of the substrate and the glass lens; and light transmitting resin that is filled in the space by injecting the resin through the resin injection hole.

In this LED, part to be sealed with light transmitting resin is provided as a minimum space to house the light emitting element and the metal member. The glass lens covers the periphery of the light emitting element while leaving a space and a resin injection hole. Further, since the substrate has a low coefficient of thermal expansion and a high thermal resistance, a difference in coefficient of thermal expansion between the substrate and the glass lens is small. Therefore, even when conducting high-temperature treatment such as reflowing, the substrate and the glass lens are securely bonded by the sealing material each other and the peeling therebetween does not occur.

The substrate, which has a low coefficient of thermal expansion and a high thermal resistance, includes a ceramics substrate such as aluminum nitride (AlN) and alumina ($Al_2O_3$).

The periphery of metal member (wire) is sealed by injecting light transmitting resin with a low viscosity through the resin injection hole and, therefore, the disconnection of wire in sealing does not occur. Further, by minimizing the space to be sealed with light transmitting resin, force to be applied to the wire due to the difference in coefficient of thermal expansion in high-temperature treatment is reduced to the minimum. Therefore, the disconnection of wire can be prevented.

Accordingly, the disconnection of wire in sealing can be prevented, and the peeling among the substrate, sealing material and glass lens and the disconnection of wire in high-temperature treatment can be prevented.

(12) In LED of (11), it is preferred that the sealing material has a coefficient of thermal expansion between the substrate and the glass lens. Thereby, a difference in coefficient of thermal expansion between the substrate and the sealing material and between the sealing material and the glass lens is further reduced. Therefore, the peeling at each interface in high-temperature treatment can be further prevented.

(13) In LED of (11), it is preferred that sealing material is of sealing glass. The sealing glass is also called "flit glass", and, by changing components composing the sealing glass and composition ratios thereof, various coefficients of thermal expansion are provided. Namely, by providing a coefficient of thermal expansion between the substrate and the glass lens, a difference in coefficient of thermal expansion between the substrate and the sealing material and between the sealing material and the glass lens can be further reduced. Therefore, the peeling at each interface in high-temperature treatment can be further prevented. Furthermore, flit glass offers bonding while causing chemical reaction between the substrate and the glass lens. Therefore, bonding force stronger than normal can be obtained.

(14) In LED of (11), it is preferred that the light transmitting resin is transparent silicone resin. The transparent silicone resin has a sufficient elasticity even after thermo-setting. Therefore, tension to be applied to the wires due to a difference in coefficient of thermal expansion when conducting high-temperature treatment is absorbed by the elasticity of transparent silicone resin itself. Accordingly, the disconnection of wire in reflowing can be further prevented.

(15) In LED of (11), it is preferred that the substrate has a resin injection hole that penetrates through the substrate and communicates with the space, instead of the resin injection hole defined by the glass lens. Thus, since the glass lens only has to be provided with the minimum space to house the light emitting element and wire, the processing of glass lens can be facilitated. Further, two or more resin injection holes may be provided near the light emitting element except for just under the wire. In this case, by injecting transparent silicone resin through one of the resin injection holes, the air included in the space can be driven out from the other of the resin injection holes. Thus, the filling of resin can be completely conducted without leaving any air bubble.

BRIEF DESCRIPTION OF THE DRAWINGS

Preferred embodiments according to the invention will be explained below referring to the drawings, wherein.

DETAILED DESCRIPTION OF THE PREFERRED EMBODIMENTS

Figure 1:
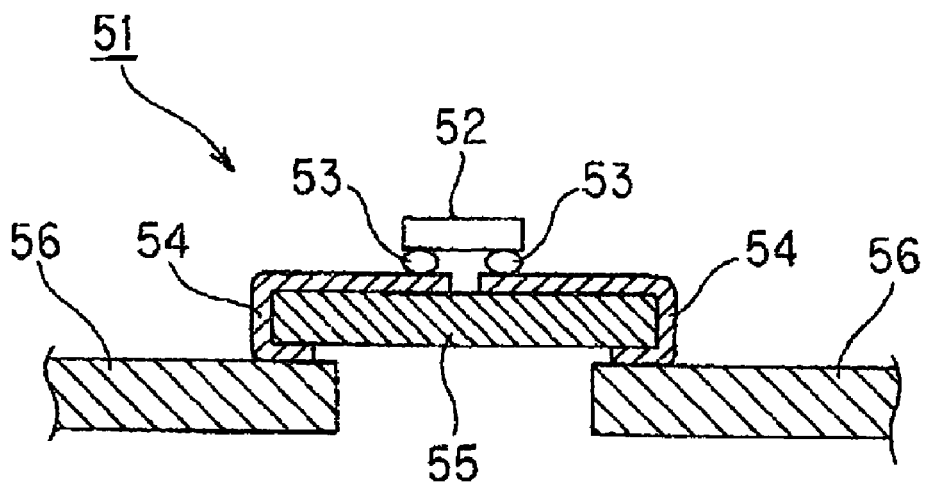
FIG. 1 is a cross sectional view showing the conventional flip-chip type LED.
Figure 2:
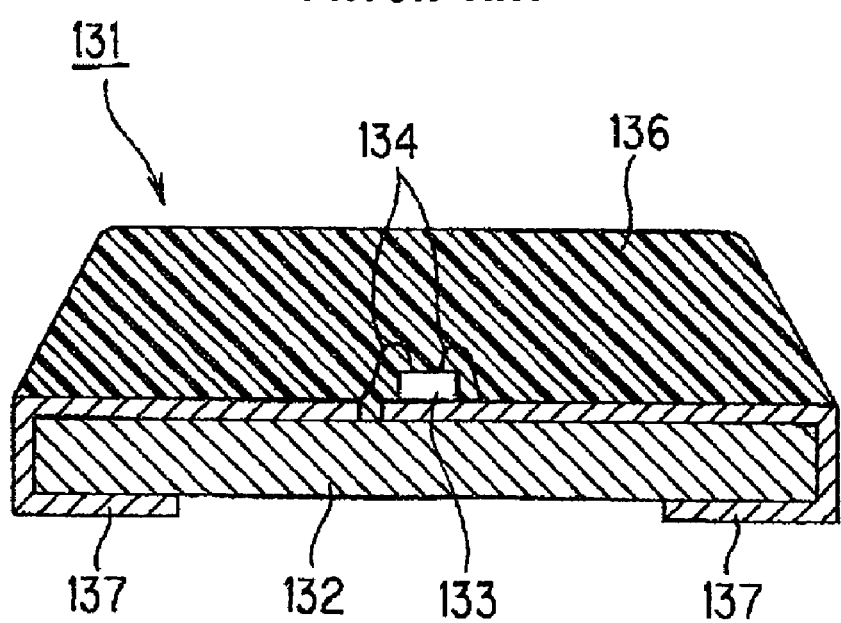
FIG. 2 is a cross sectional view showing the conventional SMD type LED.

The preferred embodiments according to the invention will be detailed below referring to the drawings.

<First Embodiment>

LED of the first preferred embodiment is described below.

Figure 3A:
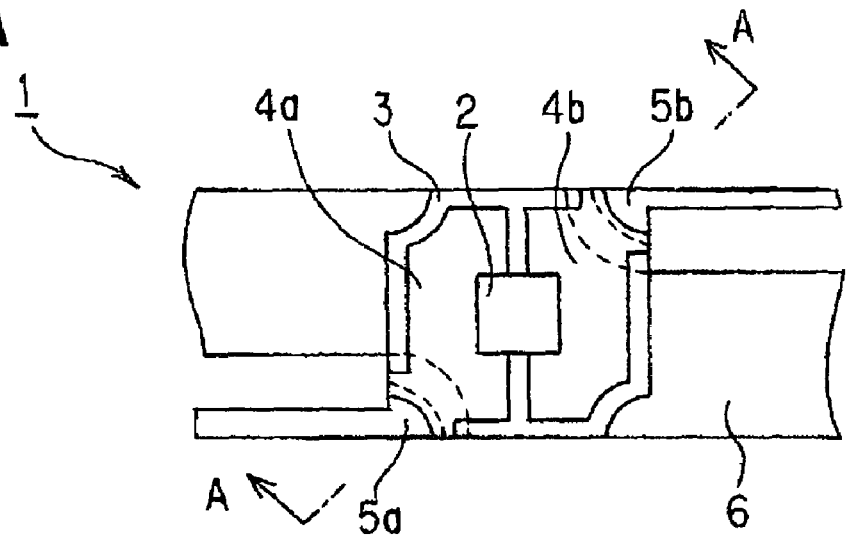
FIG. 3A is a plain view showing LED (its both ends being omitted) in a first preferred embodiment according to the invention.
Figure 3B:
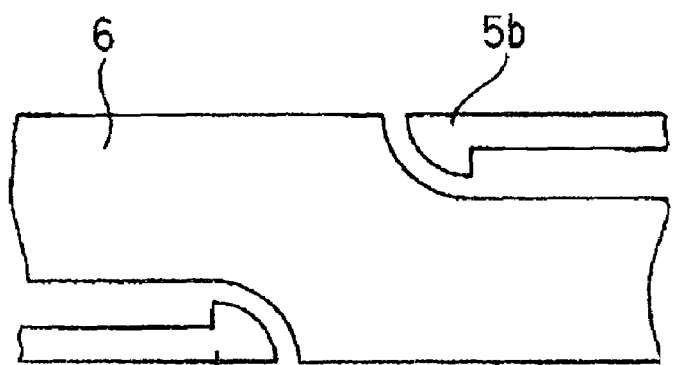
FIG. 3B is a plain view showing LED in FIG. 3A without a ceramics substrate 3 and members mounted thereon.
Figure 3C:
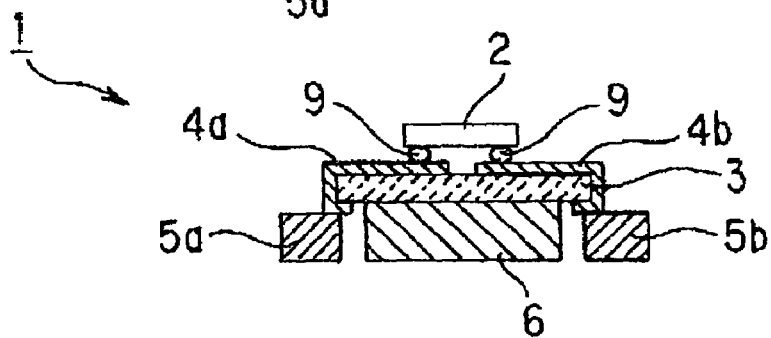
FIG. 3C is a cross sectional view cut along the line A—A in FIG. 3A.
Figure 4A:
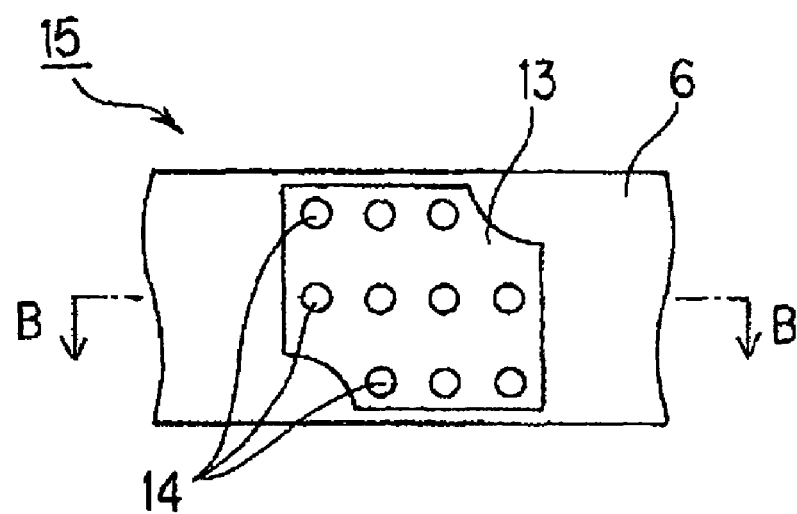
FIG. 4A is a bottom view showing a modification of LED (its both ends being omitted) in the first embodiment according to the invention.
Figure 4B:
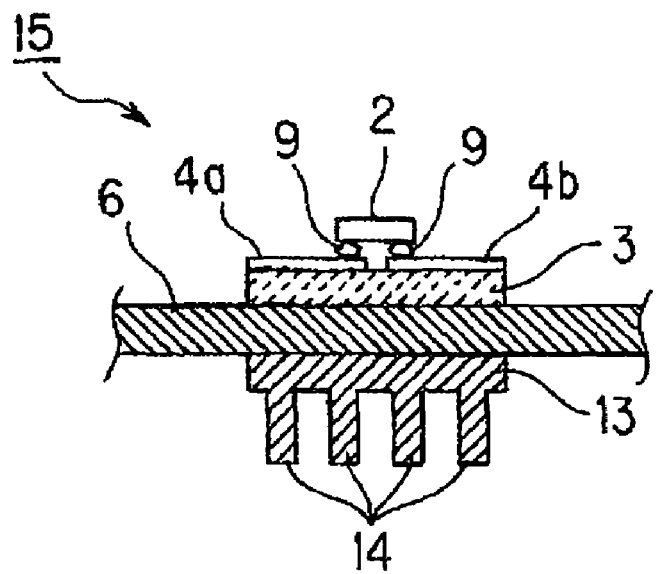
FIG. 4B is a cross sectional view cut along the line B—B in FIG. 4A.
Figure 5:
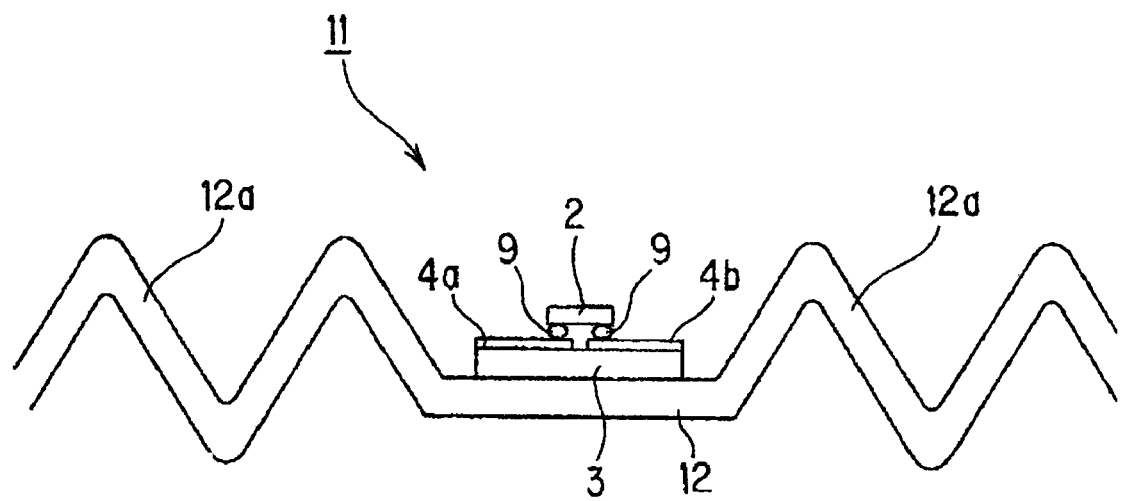
FIG. 5 is a side view showing another modification of LED (its both ends being omitted) in the first embodiment according to the invention.

FIG. 3A is the plain view showing LED (its both ends being omitted) in the first preferred embodiment according to the invention. FIG. 3B is the plain view showing LED in FIG. 3A without the ceramics substrate 3 and members mounted thereon. FIG. 3C is the cross sectional view cut along the line A—A in FIG. 3A. FIG. 4A is the bottom view showing the modification of LED (its both ends being omitted) in the first embodiment according to the invention. FIG. 4B is the cross sectional view cut along the line B—B in FIG. 4A. FIG. 5 is the side view showing another modification of LED (its both ends being omitted) in the first embodiment according to the invention.

As shown in FIG. 3B, a radiation plate 6 and power supplying terminals 5a, 5b are separately formed by pressing one member and the power supplying terminals 5a, 5b are connected with a power source (not shown). On this structure, as shown in FIG. 3A, the AlN ceramics substrate (hereinafter also referred to as AlN substrate) 3 is bonded that is cut in the form of quadrant at its four corners by punching. Circuit patterns 4a, 4b are formed on the AlN substrate 3, and their portions at right-top and left-bottom are extending through the side to the back of substrate such that they contact the power supplying terminals 5a, 5b (FIG. 3C)

Further, as shown in FIG. 3C, a light emitting element 2 is mounted through a plurality of Au bumps 9 on the circuit patterns 4a, 4b of AlN substrate 3. Meanwhile, a lens system (not shown) is provided around the light emitting element 2 to converge light emitted from the emission surface of light emitting element 2.

In the structure described above, electric power to the light emitting element 2 is supplied from the power source (not shown) through a power supplying circuit (not shown), the power supplying terminals 5a, 5b, the circuit patterns 4a, 4b, the Au bumps 9 and electrodes (not shown) of light emitting element 2. Heat generated from the light emitting element 2 is conducted through the Au bumps 9 to the circuit patterns 4a, 4b, further conducted through the entire AlN substrate 3 as ceramics substrate with high thermal conductivity to the radiation plate 6, radiated from there in the air.

The radiation plate 6 contacts most of the back surface of AlN substrate 3 including a back surface region of AlN substrate 3 where the light emitting element 2 is mounted and, therefore, an efficient radiation can be performed.

Thus, by mounting light emitting element 2 on the AlN substrate 3 that is a ceramics substrate with high thermal conductivity, a radiation property can be obtained that is equal to a structure where a light emitting element is mounted through Au bumps on thick metal leads. Furthermore, a thermally conductive material may be embedded in a gap between the light emitting element 2 and the AlN substrate 3.

Accordingly, LED 1 of the first embodiment has such a sufficient radiation property that can be adapted even to a light emitting element to be fed with large current.

FIGS. 4A and 4B show a modification of LED in the first embodiment. As shown in FIG. 4B, LED 15 of the modification has the same structure on the radiation plate 6 as LED 1. In like manner, a lens system (not shown) is provided around the light emitting element 2 to converge light emitted from the emission surface of light emitting element 2.

The difference is, as shown in FIGS. 4A and 4B, that a pin radiation plate 13 is bonded to the back surface of radiation plate 6. The pin radiation plate 13 is provided with ten radiation pins 14. Since the pin radiation plate 13 is located under the light emitting element 2, heat generated from the light emitting element 2 in operation is more rapidly radiated from the radiation pins 14 in the air. Also, localization of heat at a region near the heat generating source can be cancelled.

FIG. 5 shows another modification of LED in the first embodiment. As shown in FIG. 5, LED 11 of this modification has the same structure on the AlN substrate 3 as LED 1. In like manner, a lens system (not shown) is provided around the light emitting element 2 to converge light emitted from the emission surface of light emitting element 2.

The difference is, as shown in FIG. 5, that there is provided a radiation plate 12 of copper alloy that is bonded to the AlN substrate 3 and is folded into waveform outside the AlN substrate 3 to form a radiation fin 12a. Thus, heat generated from the light emitting element 2 in operation is conducted through the Au bumps 9 to the circuit patterns 4a, 4b, further conducted through the entire AlN substrate 3 to the radiation plate 12. Since the area of radiation plate 12 is substantially enlarged, heat is more rapidly radiated from there in the air.

Accordingly, LED 11 of this modification has such a sufficient radiation property that can be adapted even to a light emitting element to be fed with large current.

<Second Embodiment>

LED of the second preferred embodiment is described below.

Figure 6:
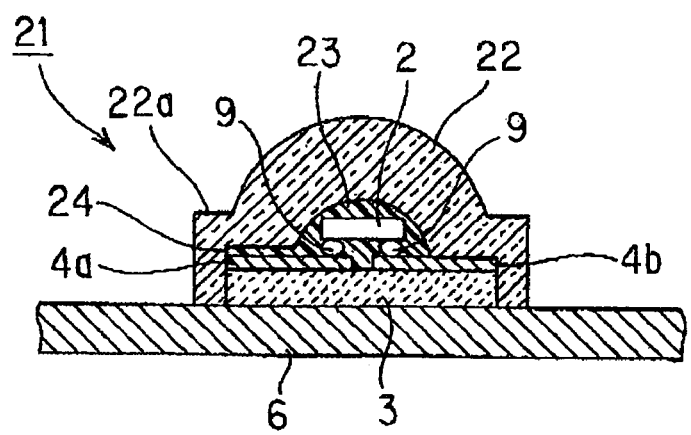
FIG. 6 is a cross sectional view showing LED (its both ends being omitted) in a second preferred embodiment according to the invention.

FIG. 6 is the cross sectional view showing LED in the second preferred embodiment according to the invention. Like components are indicated by the same numerals used in the first embodiment.

As shown in FIG. 6, LED 21 of the second embodiment is provided with a glass convex lens 22. The structure from light emitting element 2 to AlN substrate 3 housed in the glass lens 22 is the same as that of LED 1 in the first embodiment. The glass lens 22 is provided with, in its inside, a minimum space to house the light emitting element 2 and Au bumps 9 and with a resin injection hole 24. Left-end part 22a of the glass lens 22 is not formed at the beginning and the resin injection hole 24 penetrates to the outside.

The glass lens 22 is disposed on the AlN substrate 3 with the radiation plate 6, and the bonding portions between the glass lens 22 and the AlN substrate 3 and between the radiation the glass lens 22 and the radiation plate 6 are coated with sealing glass (flit glass) to be securely bonded at high temperature (around 400° C.). Since the light emitting element 2 mounted can endure such high temperature, any reduction in emission property thereof does not occur. After cooling down, transparent silicone resin 23 as light transmitting resin is injected through the resin injection hole 24 into the space to seal the light emitting element 2. Thereafter, the transparent silicone resin 23 is thermally set and the left-end part 22a is bonded to the glass lens 22. Thus, LED 21 of the second embodiment is obtained.

LED 21 thus composed uses, as convergence lens, the glass lens 22 with a low coefficient of thermal expansion and the glass lens 22 is thermally compatible with the AlN substrate 3 with a low coefficient of thermal expansion. Therefore, even when temperature changes rapidly, the glass lens 22 will not be peeled from the AlN substrate 3.

Meanwhile, when the light emitting element 2 is a blue light emitting element and a phosphor to emit yellow light in radiating blue light is mixed into the transparent silicone resin 23, LED to emit white light while mixing blue light and yellow light can be offered. Also, the transparent silicone resin as light transmitting resin to seal the light emitting element 2 and Au bumps 9 may be replaced by the other transparent resin material such as transparent epoxy resin.

Accordingly, LED 21 of the second embodiment has such a sufficient radiation property that can be adapted even to a light emitting element to be fed with large current, as well as an excellent light convergence property and a good anti-peeling property against rapid temperature change.

<Third Embodiment>

LED of the third preferred embodiment is described below.

Figure 7:
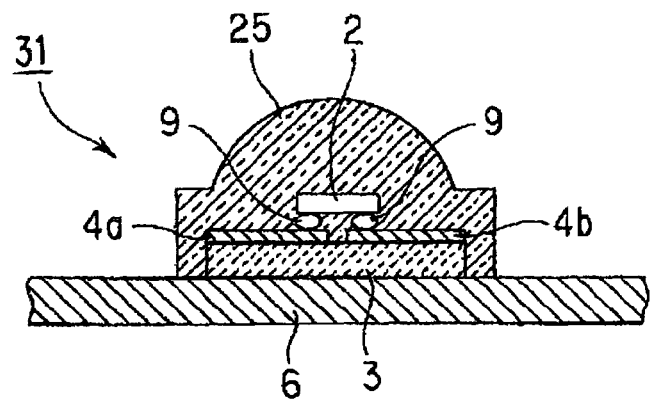
FIG. 7 is a cross sectional view showing LED (its both ends being omitted) in a third preferred embodiment according to the invention.

FIG. 7 is the cross sectional view showing LED in the third preferred embodiment according to the invention. Like components are indicated by the same numerals used in the first embodiment.

As shown in FIG. 7, LED 31 of the third embodiment is provided with a convex lens that is formed by, different from the second embodiment, directly sealing the light emitting element 2 with low melting point glass 25 without through the light transmitting resin. The low melting point glass 25 is of various kinds but the melting point is in most cases around 400° C. Therefore, since the light emitting element 2 being mounted can endure such high temperature, any reduction in emission property thereof does not occur. Although low melting point glass 25 being melted has a viscosity greater than that of light transmitting resin, there is no problem that the disconnection of wire occurs when pouring low melting point glass 25 being melded into a lens-sealing mold since the light emitting element 2 is flip-chip mounted through the Au bumps 9 on the substrate without using bonding wires.

Further, since low melting point glass 25 being melted is able to form a strong bonding structure with the AlN substrate 3 and radiation plate 6 like sealing glass, sealing glass is not needed.

LED 31 thus composed uses, as convergence lens, the low melting point glass lens 25 with a low coefficient of thermal expansion and the low melting point glass lens 25 is thermally compatible with the AlN substrate 3 with a low coefficient of thermal expansion. Therefore, even when temperature changes rapidly, the low melting point glass lens 22 will not be peeled from the AlN substrate 3.

Accordingly, LED 31 of the third embodiment has such a sufficient radiation property that can be adapted even to a light emitting element to be fed with large current, as well as an enhanced productivity, an excellent light convergence property and a good anti-peeling property against rapid temperature change.

<Fourth Embodiment>

LED and LED array of the fourth preferred embodiment is described below.

Figure 8:
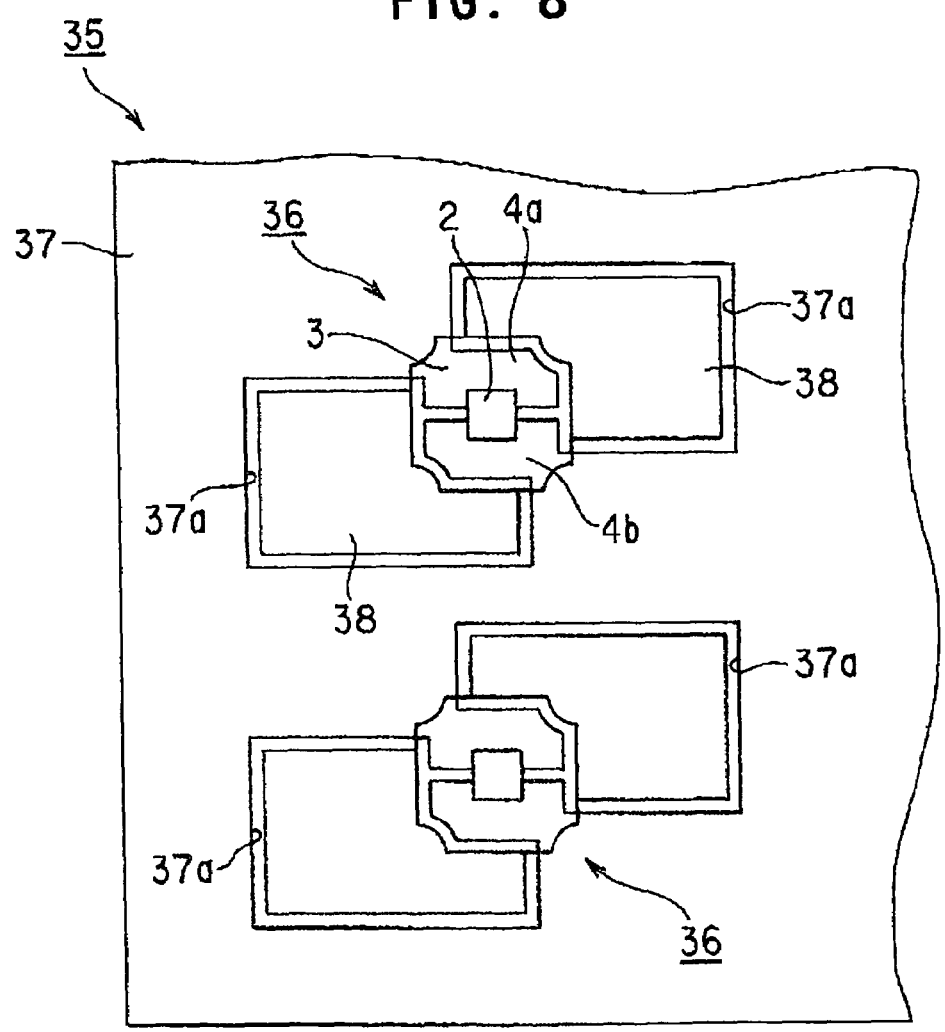
FIG. 8 is a plain view showing LED (its both ends being omitted) and part of LED array in a fourth preferred embodiment according to the invention.
Figure 9:
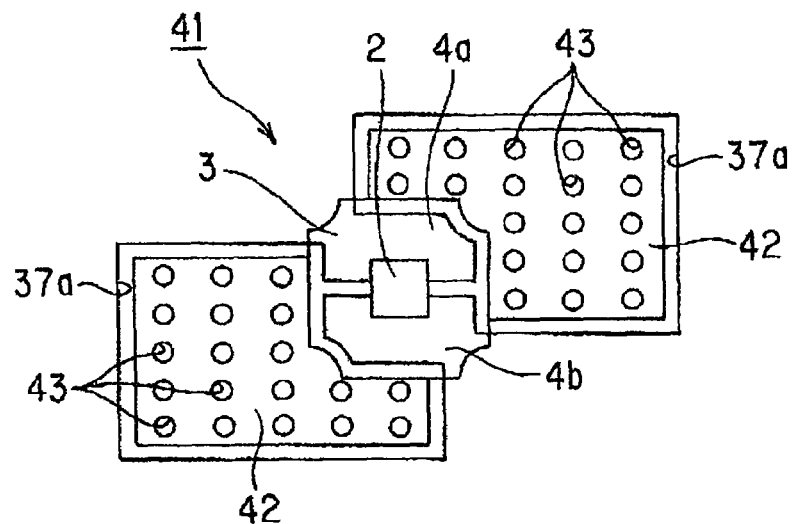
FIG. 9 is a plain view showing a first modification of LED in the fourth embodiment according to the invention.
Figure 10A:
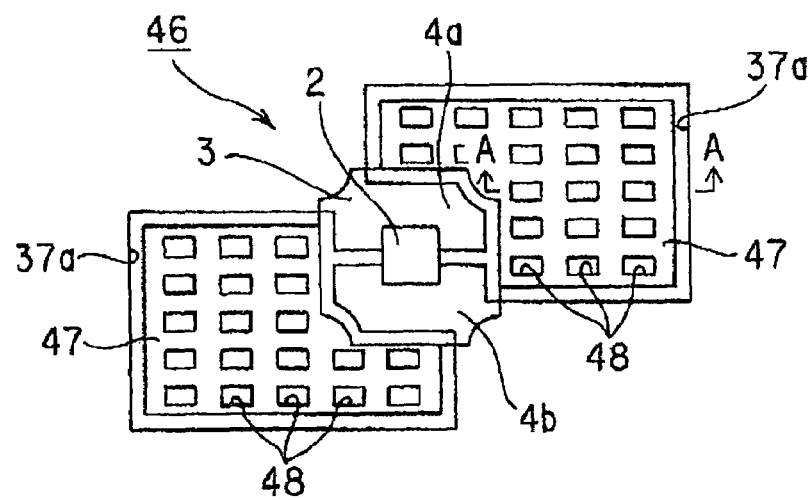
FIG. 10A is a plain view showing a second modification of LED in the fourth embodiment according to the invention.
Figure 10B:
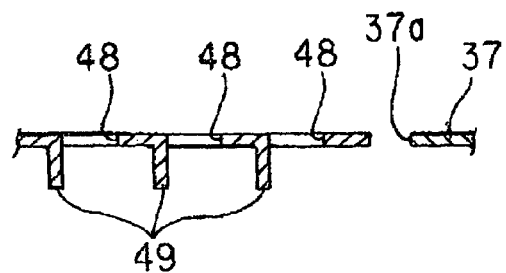
FIG. 10B is a cross sectional view cut along the line A—A in FIG. 10A.

FIG. 8 is the plain view showing LED and part of LED array in the fourth preferred embodiment according to the invention. FIG. 9 is the plain view showing the first modification of LED in the fourth embodiment according to the invention. FIG. 10A is the plain view showing the second modification of LED in the fourth embodiment according to the invention. FIG. 10B is the cross sectional view cut along the line A—A in FIG. 10A. Like components are indicated by the same numerals used in the first embodiment.

In the fourth embodiment, as shown in FIG. 8, a plurality of penetrating holes 37a are, lengthwise and crosswise, provided in a glass epoxy substrate 37 such that a shape with two rectangles connected (overlapped) is formed by each of the penetrating holes 37a. Part where two rectangles is connected (overlapped) can be regarded as part that the penetrating hole 37a is narrowed. Therefore, the penetrating hole 37a corresponds to "penetrating hole having narrowed portion" defined in the invention. The AlN substrate 3 is disposed on that narrowed portion while bridging two rectangles and the light emitting element 2 is flip-chip mounted through Au bumps (not shown) on the circuit patterns 4a, 4b formed on the surface of the AlN substrate 3.

Further, left-top portion of the circuit pattern 4a and right-bottom portion of the circuit pattern 4b are extending through the side to the back of the AlN substrate 3 and solder-bonded to a circuit pattern (not shown) on the glass epoxy substrate 37 so as to offer electrical conduction as well as fixation therebetween. In addition, a radiation plate 38 of copper alloy that is slightly smaller than the penetrating hole 37a is, by metalizing, bonded to the back of AlN substrate 3. The light emitting element 2 is provided with a lens system (not shown) on its periphery to converge light radiated from the light emitting element 2.

In LED 36 of the fourth embodiment thus composed, heat generated from the light emitting element 2 in operation is conducted through the entire AlN substrate 3 with an excellent thermal conductivity to the radiation plate 38, radiated from the surface in the air. Thus, LED 36 of the fourth embodiment has such a sufficient radiation property that can be adapted even to a light emitting element to be fed with large current.

The LED array 35 is composed of LED's 36 formed lengthwise and crosswise on the glass epoxy substrate 37. With the glass epoxy substrate 37, a plurality of LED's can be arranged in order and circuit-like arrangement of LED's can be easily and freely formed. Each of light emitting elements 2 can be easily provided with optical system such as lens system according to use.

LED 41 of the first modification in the fourth embodiment is described below.

In LED 41, as shown in FIG. 9, the penetrating hole 37a is provided in the glass epoxy substrate 37 such that a shape with two rectangles connected (overlapped) is formed by of the penetrating hole 37a. Part where two rectangles is connected (overlapped) forms part that the penetrating hole 37a is narrowed. The AlN substrate 3 is disposed on that narrowed portion while bridging two rectangles and the light emitting element 2 is flip-chip mounted through Au bumps (not shown) on the circuit patterns 4a, 4b formed on the surface of AlN substrate 3.

Further, left-top portion of the circuit pattern 4a and right-bottom portion of the circuit pattern 4b are extending through the side to the back of the AlN substrate 3 and solder-bonded to a circuit pattern (not shown) on the glass epoxy substrate 37 so as to offer electrical conduction as well as fixation therebetween. In addition, a radiation plate 42 of copper alloy that is slightly smaller than the penetrating hole 37a is solder-bonded to the back of AlN substrate 3. The light emitting element 2 is provided with a lens system (not shown) on its periphery to converge light radiated from the light emitting element 2.

The radiation plate 42 is provided with a plurality of small circular penetrating holes 43. Thereby, the convection of air around the radiation plate 42 is promoted to enhance the radiation property of radiation plate 42. Thus, heat conducted from the light emitting element 2 through the AlN substrate 3 can be efficiently radiated in the air. The penetrating hole 43 may be shaped other than circular.

By arranging a plurality of LED's 41 on the glass epoxy substrate, LED array with a more excellent radiation property can be offered.

LED 46 of the second modification in the fourth embodiment is described below.

In LED 46, as shown in FIG. 10A, the penetrating hole 37a is provided in the glass epoxy substrate 37 such that a shape with two rectangles connected (overlapped) is formed by of the penetrating hole 37a. Part where two rectangles is connected (overlapped) forms part that the penetrating hole 37a is narrowed. The AlN substrate 3 is disposed on that narrowed portion while bridging two rectangles and the light emitting element 2 is flip-chip mounted through Au bumps (not shown) on the circuit patterns 4a, 4b formed on the surface of AlN substrate 3.

Further, left-top portion of the circuit pattern 4a and right-bottom portion of the circuit pattern 4b are extending through the side to the back of the AlN substrate 3 and solder-bonded to a circuit pattern (not shown) on the glass epoxy substrate 37 so as to offer electrical conduction as well as fixation therebetween. In addition, a radiation plate 47 of copper alloy that is slightly smaller than the penetrating hole 37a is, by metalizing, bonded to the back of AlN substrate 3. The light emitting element 2 is provided with a lens system (not shown) on its periphery to converge light radiated from the light emitting element 2.

The radiation plate 47 is provided with a plurality of rectangular cuts 48 with one side left connecting with the plate, and a plurality of radiation fins 49 are formed by folding the one side downward and about vertically as shown in FIG. 10B. With the radiation fins 49 and the rectangular penetrating holes 48 formed after folding the radiation fin 49, the surface area of radiation plate 47 is increased and the convection of air is promoted. Thereby, the radiation property can be enhanced significantly. Thus, heat conducted from the light emitting element 2 through the AlN substrate 3 can be further efficiently radiated in the air. The radiation fin 49 (penetrating hole 48) may be shaped other than rectangular.

By arranging a plurality of LED's 46 on the glass epoxy substrate, LED array with a more excellent radiation property can be offered.

In the first to fourth embodiments, the circuit patterns 4a, 4b are formed using Ag plating with a high reflectivity to blue light since it is assumed that a blue light emitting element is used for the light emitting element 2. However, the light emitting element 2 may have any emission light color. When a red light emitting element is used, it is desirable that the circuit patterns are formed using Au plating with a high reflectivity to red light.

Although in the first to fourth embodiments the AlN (aluminum nitride) substrate 3 is used as ceramics substrate, any ceramics substrate may be used that has a high thermal conductivity.

The substrate used for LED array may be a ceramics substrate etc. other than glass epoxy substrate.

<Fifth Embodiment>

LED 101 of the fifth preferred embodiment is described below.

Figure 11A:
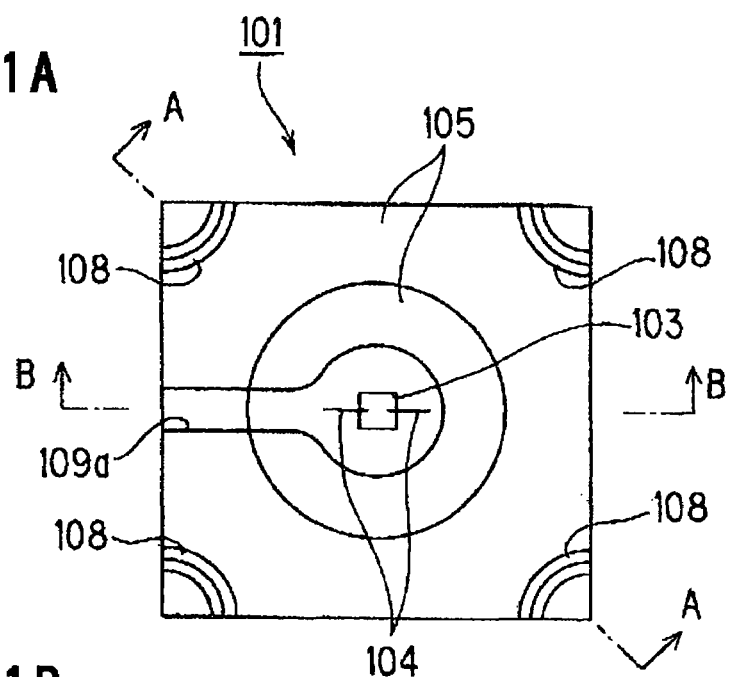
FIG. 11A is a plain view showing LED in a fifth preferred embodiment according to the invention.
Figure 11B:
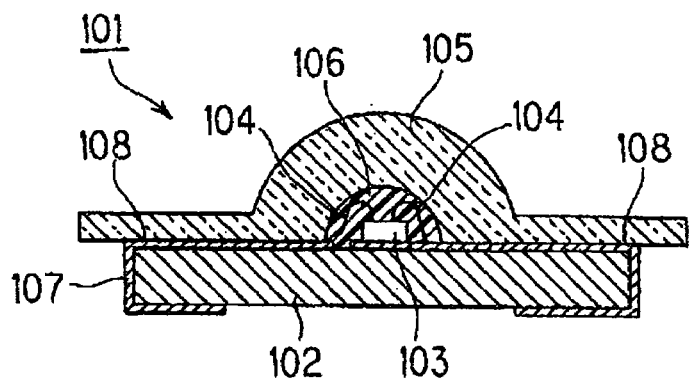
FIG. 11B is a cross sectional view cut along the line A—A in FIG. 11A.
Figure 12:
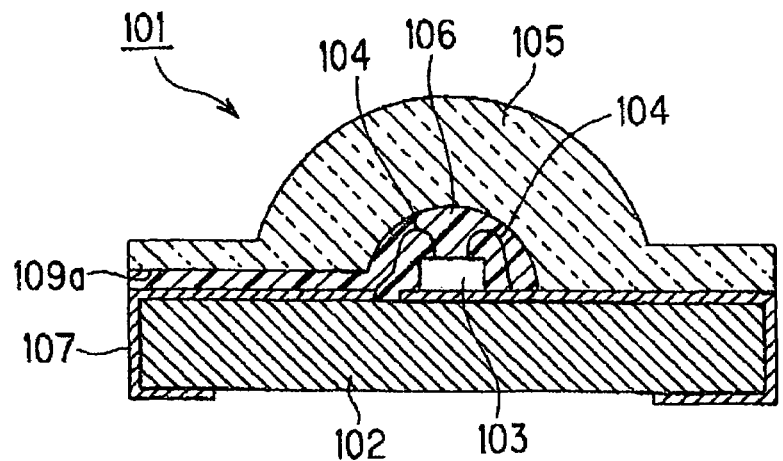
FIG. 12 is a cross sectional view cut along the line B—B in FIG. 11A.
Figure 13:
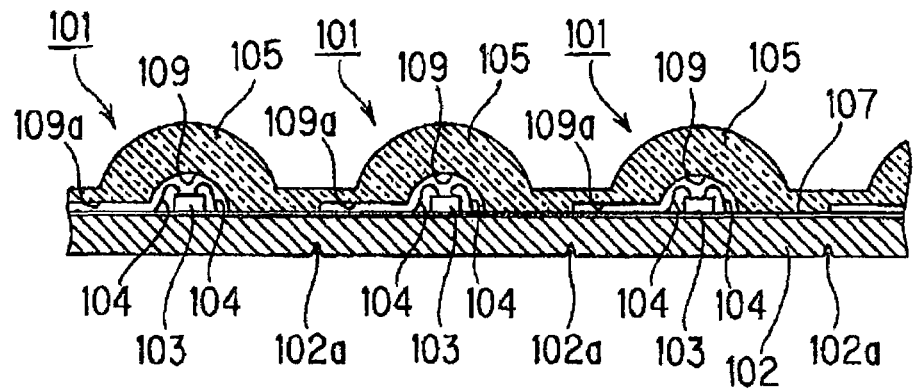
FIG. 13 is a cross sectional view showing a method of mass-producing LED in the fifth embodiment according to the invention.

FIG. 11A is the plain view showing LED in the fifth preferred embodiment according to the invention. FIG. 11B is the cross sectional view cut along the line A—A in FIG. 11A. FIG. 12 is the cross sectional view cut along the line B—B in FIG. 11A. FIG. 13 is the cross sectional view showing the method of mass-producing LED in the fifth embodiment according to the invention.

As shown in FIGS. 11A and 11B, a ceramics substrate 102 with through-holes (not shown) and circuit patterns 107 formed by Ag plating is cut in the form of quadrant at its four corners, and plate potion in the periphery of a square glass lens 105 is mounted on the substrate 102. As shown in FIG. 11B, which is a cross sectional view cut in the diagonal direction, the plate portion of glass lens 105 is protruded from the ceramics substrate 102 at the four corners. A light emitting element 103 is mounted on the ceramics substrate 102, and two electrodes (not shown) formed on the light emitting element 103 each are bonded through two Au wires to a predetermined position in the circuit pattern 107 on the ceramics substrate 102 Further, on the substrate, the glass lens 105 is mounted that is provided with, in its inside, a minimum space to house the light emitting element 103 and wires 104 and with a resin injection hole 109a. The plate portion of glass lens 105 is securely bonded to the ceramics substrate 102 at high temperature (around 400° C.) by using sealing glass 108 to be coated in the form of quadrant at the four corners of glass lens 105. Since the light emitting element 103 mounted can endure such high temperature, any reduction in emission property thereof does not occur. The ceramics substrate 102 is of aluminum nitride (AlN) ceramics and has a low coefficient of thermal expansion ($4.5 \times 10^{-6}$/° C.) and a high thermal resistance.

Thus, a difference in coefficient of thermal expansion between the AlN substrate 102 and the glass lens 105 with a low coefficient of thermal expansion is small. Further, the sealing glass 108 has a coefficient of thermal expansion between the ceramics substrate 102 and the glass lens 105. Therefore, a difference in coefficient of thermal expansion between the AlN substrate 102 and the sealing glass 108 and between the sealing glass 108 and the glass lens 105 becomes smaller. So, even when conducting a high-temperature treatment such as reflowing (200-300° C.), there occurs no peeling at the interface between the AlN substrate 102 and the sealing glass 108 and between the sealing glass 108 and the glass lens 105, and therefore the AlN substrate 102 is securely bonded to the glass lens 105 by the sealing glass 108.

The reason why the sealing glass 108 is coated at the four corners in the plate portion of glass lens 105 is that the sealing glass 108 is generally black and it is needed to keep it as far away from the light emitting element as possible so as not to badly affect the emission property. If the sealing glass 108 is white series, it may be coated nearer to the center.

The injection of light transmitting resin is explained below.

FIG. 12 is the cross sectional view cut along the line B—B in FIG. 11A. As shown in FIG. 12, between the AlN substrate 102 and the glass lens 105 bonded together, there is provided the minimum space to house the light emitting element 103 and the wires 104 and the resin injection hole 109a. Transparent silicone resin 106 as light transmitting resin is injected through the resin injection hole 109a into the space to seal the light emitting element 103 and wires 104. Since the transparent silicone resin 106 has a low viscosity before being set, the disconnection of wire does not occur when injecting the transparent silicone resin 106. Thereafter, by thermo-setting the transparent silicone resin 106, LED 101 of the fifth embodiment can be obtained.

By thus minimizing the volume to be sealed with the light transmitting resin 106, tension to be applied to the wires 104 due to the difference in coefficient of thermal expansion when conducting high-temperature treatment becomes minimum and, thereby, the disconnection of wire 104 can be prevented. Further, by using the transparent silicone resin 106 as light transmitting resin, the tension to be applied to the wires 104 due to the difference in coefficient of thermal expansion when conducting high-temperature treatment is absorbed by the transparent silicone resin 106 itself since the transparent silicone resin 106 has an elasticity even after being thermo-set and, thereby, the disconnection of wire 104 can be further securely prevented.

As described above, LED 101 of the fifth embodiment can avoid the disconnection of wire in sealing and the peeling among the substrate, sealing material and glass lens and the disconnection of wire in high-temperature treatment such as reflowing.

The method of mass-producing LED 101 is explained below.

FIG. 13 is the cross sectional view showing the method of mass-producing LED in the fifth embodiment according to the invention. At first, a ceramics (AlN) substrate 102 is prepared that has a dimension several times greater than LED 101. Through-holes (not shown) are formed at predetermined positions in the substrate 102, and a circuit pattern 107 is formed by Ag plating. Notches 102a are formed lengthwise and crosswise at positions to be cut off in the final stage on the back surface of AlN substrate 102. Then, light emitting elements 103 are mounted on the surface of AlN substrate 102 at a predetermined position, and one ends of Au wires 104 are bonded to two surface electrodes of each light emitting element 103 and the other ends are bonded to the circuit pattern 107 at predetermined positions.

After all of the light emitting elements 103 and wires 104 are attached, glass lenses 105 are mounted and sealed. Namely, as shown in FIG. 13, a glass member is first prepared that has an equal size to the AlN substrate 102 and that a plurality of glass lenses 105 each being provided with the minimum space 109 to house the light emitting element 103 and wires 104 and with the resin injection hole 109a are connected lengthwise and crosswise. Then, sealing glass is coated on the upper surface of AlN substrate 102 or on the lower surface of glass lens 105, and the glass member with the plurality of glass lenses 105 is mounted on the AlN substrate 102 and sealed at a sealing temperature (around 400° C.).

After cooling, each LED 101 (without sealing resin injected) is separated by cleaving using the notch 102a previously formed on the lower surface of AlN substrate 102 or by cutting using a dicing machine. Then, as described with reference to FIG. 12, transparent silicone resin is injected through the resin injection hole 109a into the space 109 to seal the light emitting element 103 and wires 104, and the transparent silicone resin is thermo-set. Thus, LED 101 of the fifth embodiment can be mass-produced.

<Sixth Embodiment>

LED of the sixth embodiment is explained below.

Figure 14A:
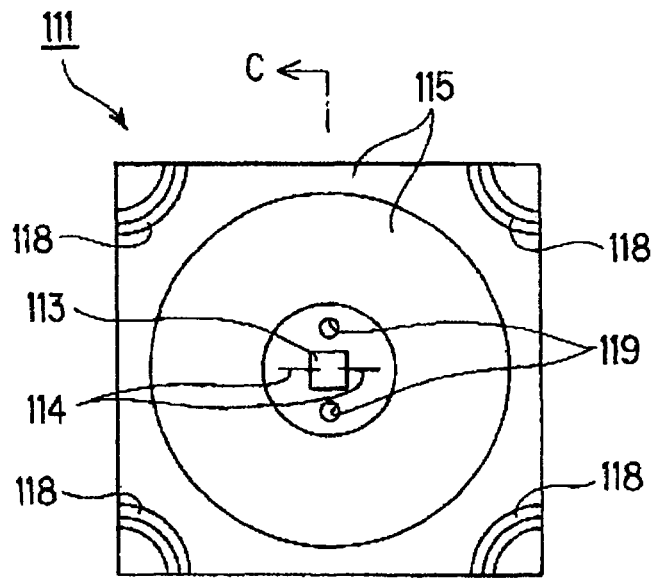
FIG. 14A is a plain view showing LED in a sixth preferred embodiment according to the invention.
Figure 14B:
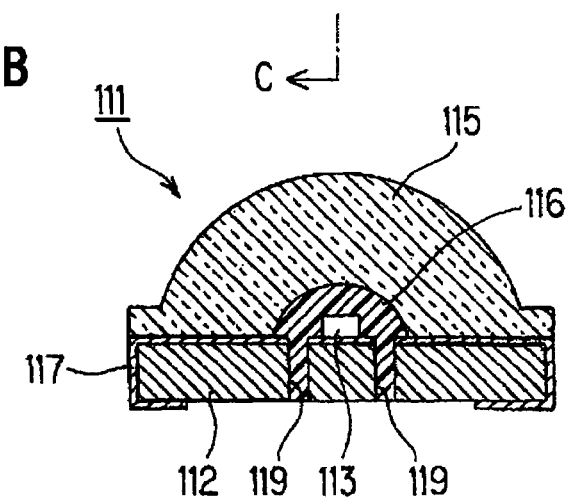
FIG. 14B is a cross sectional view cut along the line C—C in FIG. 14A.

FIG. 14A is the plain view showing LED in the sixth preferred embodiment according to the invention. FIG. 14B is the cross sectional view cut along the line C—C in FIG. 14A.

As shown in FIGS. 14A and 14B, LED 111 of the sixth embodiment, like the fifth embodiment, is composed such that a ceramics substrate 112 with through-holes (not shown) and circuit patterns 117 formed by Ag plating is cut in the form of quadrant at its four corners, and plate potion in the periphery of a square glass lens 115 is mounted on the substrate 112. As shown in FIG. 14B, a light emitting element 113 is mounted on the ceramics substrate 112 of AlN, and two electrodes (not shown) formed on the light emitting element 113 each are bonded through two Au wires to a predetermined position in the circuit pattern 117 on the ceramics substrate 112 Further, on the substrate, the glass lens 115 is mounted that is provided with, in its inside, a minimum space to house the light emitting element 113 and wires 114. The plate portion of glass lens 115 is securely bonded to the ceramics substrate 112 at high temperature (around 400° C.) by using sealing glass 118 to be coated in the form of quadrant at the four corners of glass lens 115. Since the light emitting element 113 mounted can endure such high temperature, any reduction in emission property thereof does not occur. The ceramics substrate 112 is of aluminum nitride (AlN) ceramics and has a low coefficient of thermal expansion and a high thermal resistance.

Thus, a difference in coefficient of thermal expansion between the AlN substrate 112 and the glass lens 115 with a low coefficient of thermal expansion is small. Further, the sealing glass 118 has a coefficient of thermal expansion between the ceramics substrate 112 and the glass lens 115. Therefore, a difference in coefficient of thermal expansion between the AlN substrate 112 and the sealing glass 118 and between the sealing glass 118 and the glass lens 115 becomes smaller. So, even when conducting a high-temperature treatment such as reflowing (200-300° C.), there occurs no peeling at the interface between the AlN substrate 112 and the sealing glass 118 and between the sealing glass 118 and the glass lens 115, and therefore the AlN substrate 112 is securely bonded to the glass lens 115 by the sealing glass 118.

The injection of light transmitting resin is explained below.

As shown in FIG. 14B, in the sixth embodiment, two resin injection holes 119 that communicate with the minimum space formed inside the glass lens 115 to house the light emitting element 113 and the wires 114 are formed in the AlN substrate 112. Transparent silicone resin 106 as light transmitting resin is injected through the resin injection holes 119 into the space to seal the light emitting element 113 and wires 114. Since the transparent silicone resin 116 has a low viscosity before being set, the disconnection of wire does not occur when injecting the transparent silicone resin 116.

By injecting the transparent silicone resin 116 through only one of the resin injection holes 119, the air included in the space can be driven out from the other of the resin injection holes 119. Thus, the filling of resin can be conducted easily without leaving any air bubble.

By thus minimizing the volume to be sealed with the light transmitting resin 116, tension to be applied to the wires 114 due to the difference in coefficient of thermal expansion when conducting high-temperature treatment becomes minimum and, thereby, the disconnection of wire 114 can be prevented. Further, by using the transparent silicone resin 116 as light transmitting resin, the tension to be applied to the wires 114 due to the difference in coefficient of thermal expansion when conducting high-temperature treatment is absorbed by the transparent silicone resin 116 itself since the transparent silicone resin 116 has an elasticity even after being thermo-set and, thereby, the disconnection of wire 114 can be further securely prevented. Also, by providing two resin injection holes 109 in AlN substrate 112, the injection of transparent silicone resin 116 as well as the processing of glass lens 115 can be facilitated.

As described above, LED 111 of the sixth embodiment can avoid the disconnection of wire in sealing and the peeling among the substrate, sealing material and glass lens and the disconnection of wire in high-temperature treatment such as reflowing, and becomes easy to produce.

In the fifth and six embodiments, the circuit patterns 107, 110 are formed using Ag plating with a high reflectivity to blue light since it is assumed that a blue light emitting element is used for the light emitting element 103 or 113. However, the light emitting element may have any emission light color. When a red light emitting element is used, it is desirable that the circuit patterns are formed using Au plating with a high reflectivity to red light.

Although in the fifth and six embodiments AlN (aluminum nitride) is used as substrate material, any material maybe used that has a low coefficient of thermal expansion and a high thermal conductivity. Especially, a material with a high thermal conductivity such as $Al_2O_3$ is desirable.

Although in the fifth and six embodiments transparent silicone resin is used as light transmitting resin to seal the light emitting element and wires, another resin such as transparent epoxy resin may be used.

Further, the light emitting element with electrodes formed on the upper surface may be electrically connected through wires, or the light emitting element with electrodes formed on the lower surface may be electrically connected through bumps.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

What is claimed is:

1. A light emitting diode, comprising:
a ceramics substrate that has a high thermal conductivity;
a light emitting element that is mounted on the ceramics substrate; and
a radiation plate that is bonded to a back surface of the ceramics substrate;
wherein the radiation plate contacts the ceramics substrate at a contact region that includes a region of the back surface of the ceramics substrate corresponding to a region of the ceramics substrate on which the light emitting element is mounted.

2. The light emitting diode according to claim 1, wherein:
the light emitting element is flip-chip mounted on the ceramics substrate.

3. The light emitting diode according to claim 1, wherein:
the radiation plate is comprised of a metal and is folded into a waveform outside the ceramics substrate.

4. The light emitting diode according to claim 1, wherein:
the radiation plate has a plurality of penetrating holes.

5. The light emitting diode according to claim 1, wherein:
the radiation plate is comprised of a metal and is provided with a plurality of radiation fins that are formed by making a cut in the radiation plate and bending an inside portion of the cut to form a radiation fin.

6. A light emitting diode array, comprising:
a ceramics substrate that has a high thermal conductivity;
a light emitting element that is mounted on the ceramics substrate; and
a radiation plate that is bonded to a back surface of the ceramics substrate;
wherein the radiation plate contacts the ceramics substrate at a contact region that includes a region of the back surface of the ceramics substrate corresponding to a region of the ceramics substrate on which the light emitting element is mounted; and
a circuit board on which the plurality of light emitting diodes are mounted, the circuit board including a through hole.

7. A light emitting diode, comprising:
a circuit board that includes a plurality of penetrating holes, each having a narrowed portion;
a ceramics substrate that is mounted on the circuit board while bridging the narrowed portion, the ceramics substrate having a high thermal conductivity;
a light emitting element that is mounted on a circuit pattern of the ceramics substrate; and
a radiation plate that is bonded to a back surface of the ceramics substrate and extends in one of the plurality of penetrating holes without contacting the edge of the penetrating hole,
wherein the circuit pattern of the ceramics substrate is electrically connected to a circuit pattern of the circuit board at the bridged narrowed portion.

8. A light emitting diode array, comprising a plurality of the light emitting diodes defined in claim 7.

9. The light emitting diode according to claim 7, wherein:
the radiation plate has a plurality of penetrating holes.

10. The light emitting diode array according to claim 8, wherein:
the radiation plate has a plurality of penetrating holes.

11. The light emitting diode according to claim 7, wherein:
the radiation plate is comprised of a metal and is provided with a plurality of radiation fins that are formed by making a cut in the radiation plate and folding an inside portion of the cut.

12. The light emitting diode array according to claim 8, wherein:

the radiation plate is comprised of a metal and is provided with a plurality of radiation fins that are formed by making a cut in the radiation plate and folding an inside portion of the cut.

13. A light emitting diode, comprising:
a substrate that has a low coefficient of thermal expansion and a high thermal resistance;
a circuit pattern that is formed using a conductive material on the substrate;
a light emitting element that is mounted on a surface of the substrate;
a metal member that electrically connects the light emitting element to the circuit pattern;
a glass lens that covers a periphery of the light emitting element while leaving a space and a resin injection hole, the space being defined to house the light emitting element and the metal member;
a sealing material that seals the surface of the substrate and the glass lens; and
light transmitting resin that is filled in the space by injecting the resin through the resin injection hole.

14. The light emitting diode according to claim 13, wherein:
the sealing material has a coefficient of thermal expansion between the substrate and the glass lens.

15. The light emitting diode according to claim 13, wherein:
the sealing material comprises a sealing glass.

16. The light emitting diode according to claim 13, wherein:
the light transmitting resin comprises a transparent silicone resin.

17. The light emitting diode according to claim 13, wherein:
the substrate has a resin injection hole that penetrates through the substrate and communicates with the space, instead of the resin injection hole defined by the glass lens.

18. The light emitting diode according to claim 1, further comprising:
a power supplying terminal that is bonded to the back surface of the ceramics substrate at a portion except a region that the radiation plate is bonded to the back surface of the ceramics substrate.

* * * * *